United States Patent [19]
Miura et al.

[11] Patent Number: 5,946,597
[45] Date of Patent: Aug. 31, 1999

[54] SEMICONDUCTOR CHIP MOUNTING METHOD

[75] Inventors: Michio Miura; Kenzaburou Iijima, both of Hamamatsu, Japan

[73] Assignee: Yamaha Corporation, Japan

[21] Appl. No.: 08/949,702

[22] Filed: Oct. 14, 1997

[30] Foreign Application Priority Data

Oct. 14, 1996 [JP] Japan ..................................... 8-291164
Oct. 21, 1996 [JP] Japan ..................................... 8-297744

[51] Int. Cl.$^6$ .................................................. H01L 21/44
[52] U.S. Cl. ...................................... 438/662; 228/180.22
[58] Field of Search .................................... 438/108, 125, 438/662; 228/179.1, 180.1, 180.21, 180.22

[56] References Cited

U.S. PATENT DOCUMENTS 5,250,469  10/1993  Tanaka et al. ...................... 228/180.22
5,305,944   4/1994  Yoshida et al. ..................... 228/180.22

Primary Examiner—Kevin M. Picardat

[57] ABSTRACT

A semiconductor chip mounting method consisting of steps is performed to mount a semiconductor chip on a substrate. Herein, an electrode is formed on a main surface of the semiconductor chip and is covered with an insulating film. A contact hole is formed through the insulating film to be in contact with a part of the electrode. In addition, a Ni layer is formed to cover the contact hole. A wiring layer is formed on a main surface of the substrate and is covered with an insulating film. To achieve laser beam bonding effected between the semiconductor chip and substrate, a solder is provided for either the semiconductor chip or the substrate. For example, it is possible to provide a solder layer which is formed through a part of the insulating film to be in contact with the wiring layer of the substrate; or it is possible to provide a solder bump which projects from a concavity of the Ni layer of the semiconductor chip. Next, a laser beam is irradiated through the substrate, having laser beam permeability, and toward the solder. Thus, the semiconductor chip is bonded together with the substrate. Incidentally, a diameter in irradiation of the laser beam can be narrowed within a range between 1 $\mu$m and 25 $\mu$m, for example. This brings a reduction in a contact area between the semiconductor chip and substrate which are bonded together. Results of our studies show that a good electric connection can be provided between the electrode of the semiconductor chip and the wiring layer of the substrate under a limited condition where the Ni layer and the wiring layer both have a thickness which ranges between 0.6 $\mu$m and 3 $\mu$m, for example.

12 Claims, 6 Drawing Sheets

SEMICONDUCTOR CHIP MOUNTING METHOD

BACKGROUND OF THE INVENTION

1. Field of the Invention

This invention relates to semiconductor chip mounting methods for mounting semiconductor chips such as IC chips on boards (or substrates). This application is based on patent application No. Hei 8-291164 and patent application No. Hei 8-297744 both filed in Japan, the contents of which are incorporated herein by reference.

2. Prior Art

The conventional technology of the semiconductor chip mounting method uses the face-down bonding technique to mount a semiconductor chip on a substrate. Examples of the semiconductor chips to be mounted on the substrate are shown in FIGS. 11 and 12.

In FIG. 11, an insulating film 2 made of material such as silicon oxide is formed on a main surface of a semiconductor chip 1. On the insulating film 2, an electrode 3 is formed to contain a WSi layer 3a and an Al layer 3b, where 'WSi' stands for tungsten silicide while 'Al' stands for aluminum. The electrode 3 is covered with an insulating film 4 such as silicon nitride. In addition, an insulating film 5 such as silicon oxide is formed on the insulating film 4. Through the lamination of the insulating films 4 and 5, a contact hole P is formed to match with a part of the electrode 3. An Au bump 6 (where 'Au' stands for gold) is formed inside of the contact hole P on the electrode 3. Herein, the Au bump 6 is formed in a two-stage structure by using an Au wire bonder.

Now, mounting (or packaging) is carried out by turning over the semiconductor chip 1 to direct the Au bump 6 downwardly. Herein, the face-down bonding technique is effected such that the Au bump 6 of the semiconductor chip 1 is securely fixed to a wiring layer of a substrate (not shown) by adhesive.

Similar to the semiconductor chip of FIG. 11, the semiconductor chip 1 of FIG. 12 is formed such that the electrode 3 and the insulating films 4, 5 are sequentially formed on the insulating film 2. In FIG. 12, a contact hole is formed through the lamination of the insulating films 4 and 5 to match with a part of the electrode 3. Then, a Ti film 7a and a Ni film 7b (where Ti stands for titanium while Ni stands for nickel) are sequentially formed to cover the contact hole and insulating film 5. Thereafter, a photolithography process and a selective etching process are effected to perform patterning on the lamination of the films 7a and 7b. Thus, a barrier layer 7 is formed using remaining parts of the films 7a and 7b which remain in the contact hole and its peripheral portion. Thereafter, an Au bump 8 is formed on the barrier layer 7 to project upwardly from the contact hole. The Au bump 8 is formed by the selective Au plating process in which resist is used as mask, for example. In addition, the Au bump 8 has a size roughly defined by a rectangular area of 20 $\mu$m×20 $\mu$m and a height of 20 $\mu$m.

At mounting, the semiconductor chip 1 of FIG. 12 is turned over to direct the Au bump 8 downwardly. Then, the face-down bonding technique is performed such that the Au bump 8 is securely fixed to a wiring layer of a substrate (not shown) by solder or conductive adhesive.

According to the method which is described in conjunction with FIG. 11, the wire bonder is used to form the Au bump 6 having the two-stage structure. For this reason, the electrode 3 requires at least an area of 70 $\mu$m×70 $\mu$m or so. This raises a disadvantage that reduction of size of the electrode (and therefore reduction of size of the chip) should be limited.

According to the method which is described in conjunction with FIG. 12, it is possible to form the Au bump 8 in a considerably small size. However, this method requires complicated processes (or steps) which are troublesome in manufacturing. In addition, this method requires Au plating which is expensive in cost.

SUMMARY OF THE INVENTION

It is an object of the invention to provide a semiconductor chip mounting method which is capable of reducing size of the electrode and therefore size of the chip with low cost.

A semiconductor chip mounting method of this invention is effected with respect to a semiconductor chip and a substrate which are designed to have special construction. The semiconductor chip is constructed in such a way that an electrode is formed on a main surface of the semiconductor chip and is covered with an insulating film. A contact hole is formed through the insulating film to be in contact with a part of the electrode. In addition, a Ni layer is formed to cover the contact hole. The substrate is constructed in such a way that a wiring layer is formed on a main surface of the substrate and is covered with an insulating film.

This invention is characterized by using the technique of laser beam bonding. To achieve this, a solder is provided for either the semiconductor chip or the substrate. For example, it is possible to provide a solder layer which is formed through a part of the insulating film to be in contact with the wiring layer of the substrate; or it is possible to provide a solder bump which projects from a concavity of the Ni layer of the semiconductor chip.

Next, a laser beam is irradiated through the substrate, having laser beam permeability, and toward the solder. Thus, the semiconductor chip is bonded together with the substrate.

Thanks to usage of the laser beam bonding, it is possible to reduce a contact area between the semiconductor chip and substrate. Herein, a diameter in irradiation of the laser beam can be narrowed within a range between 1 $\mu$m and 25 $\mu$m, for example.

Moreover, results of our studies show that a good electric connection can be provided between the electrode of the semiconductor chip and the wiring layer of the substrate under a limited condition where the Ni layer and the wiring layer both have a thickness which ranges between 0.6 $\mu$m and 3 $\mu$m, for example.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Figure 1:
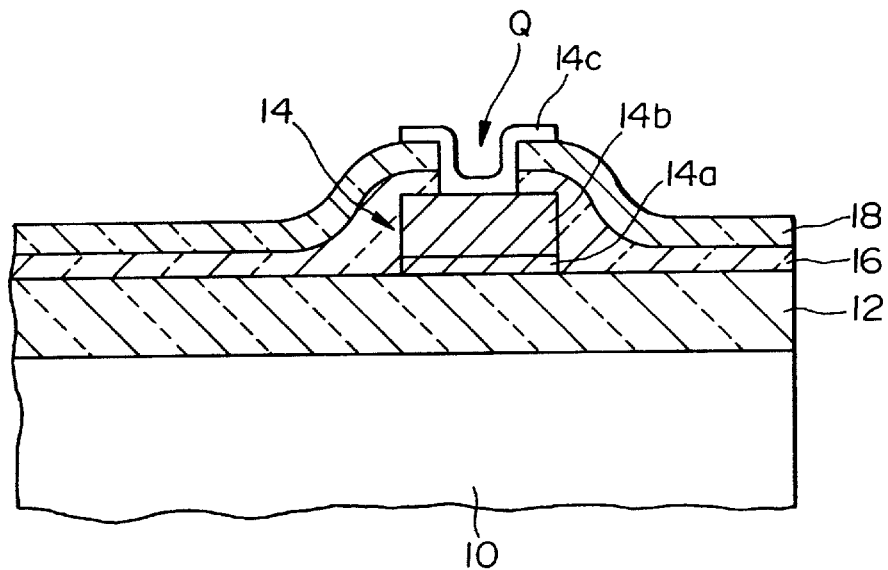
FIG. 1 is a cross sectional view showing a structure of a semiconductor chip which is provided for a semiconductor chip mounting method in accordance with an embodiment of the invention.

An example of a semiconductor chip mounting method will be explained in accordance with an embodiment of the invention with reference to FIGS. 1 to 3. Herein, the semiconductor chip mounting method requires three steps (1) to (3) which are respectively shown by FIGS. 1 to 3.

(1) First Step

There is provided a semiconductor chip 10 which is made of silicon material, for example, and which contains an IC (or ICs) therein. In FIG. 1, an insulating film 12 such as silicon oxide is formed on a main surface of the semiconductor chip 10. An electrode 14 is formed on the insulating film 12. Herein, the electrode 14 corresponds to lamination of a WSi layer 14a and an Al layer 14b. Incidentally, the WSi layer 14a can be replaced with a MoSi layer (where 'MoSi' stands for molybdenum silicide), while the Al layer 14b can be replaced with Al alloy layer (e.g., Al—Si—Cu layer), for example. There are provided a plurality of electrodes 14 which are arranged along four sides of a rectangular shape of the semiconductor chip 10. For convenience' sake, FIG. 1 shows only one electrode 14.

Insulating films 16 and 18 are formed on the insulating film 12 to cover the electrode 14 in accordance with the CVD method (where 'CVD' stands for chemical vapor deposition). For example, the insulating film 16 can be made by a silicon nitride film having a thickness of 1000 nm, while the insulating film 18 can be made by a silicon oxide film having a thickness of 150 nm.

A contact hole Q is formed through lamination of the insulating films 16 and 18 to match with a part of the electrode 14 in accordance with a photolithography process and selective etching process. A Ni layer is formed on the insulating layer 18 to cover the contact hole Q in accordance with sputtering method. In addition, photolithography process and selective etching process is effected to perform patterning of the Ni layer, so that a Ni layer 14c is formed to cover the inside of the contact hole Q and peripheral portion of the contact hole Q. Herein, the Ni layer 14c is used as a connection layer which is connected to a wiring layer of a substrate. For example, the Ni layer 14c is formed to have a thickness of 100 nm.

(2) Second Step

A substrate 20 is provided before or after provision of the semiconductor chip 10. Or, the substrate 20 is provided in parallel with provision of the semiconductor chip 10. As the substrate 20, it is possible to employ a glass substrate having laser beam permeability, for example. As glass material for the substrate, it is preferable to use certain glass material whose coefficient of thermal expansion approximates to that of the silicon material. For example, the coefficient of thermal expansion ranges between $25 \times 10^{-7}/°$ C. and $40 \times 10^{-7}°$ C. under the temperature ranging between 30° C. and 300° C. for example.

A wiring layer 22 is formed on the main surface of the substrate 20. Herein, the wiring layer 22 corresponds to lamination of an ITO layer 22a and a Cu layer 22b, where 'ITO' stands for yttrium tin oxide whilst 'Cu' stands for copper. The ITO layer 22a is a conductive layer having transparency to laser beams. The ITO layer 22a is formed to have a thickness ranging between 1 $\mu$m and 20 $\mu$m, for example. In addition, the Cu layer 22b is formed to have a thickness ranging between 1 $\mu$m and 5 $\mu$m, for example. There are provided a plenty of wiring layers 22, a number of which corresponds to a number of the electrodes 14 which are provided for the semiconductor chip 10. For convenience' sake, however, FIG. 2 shows only one wiring layer 22. Incidentally, the wiring layer 22 can be formed using the ITO layer 22a only by omitting the Cu layer 22b. Or, a Ni layer can be used instead of the ITO layer 22a. In that case, the wiring layer 22 is formed by laminating the Cu layer 22b on the Ni layer.

An insulating film 24 such as polyimide resin is formed to cover the wiring layer 22 on the main surface of the substrate 20. The insulating film 24 can be formed to have a thickness ranging between 1 $\mu$m and 3 $\mu$m, for example. A contact hole is formed through the insulating film 24 in desired shape and desired size. Then, a solder layer 22c having a thickness ranging between 1 $\mu$m and 5 $\mu$m is formed inside of the contact hole.

Figure 10:
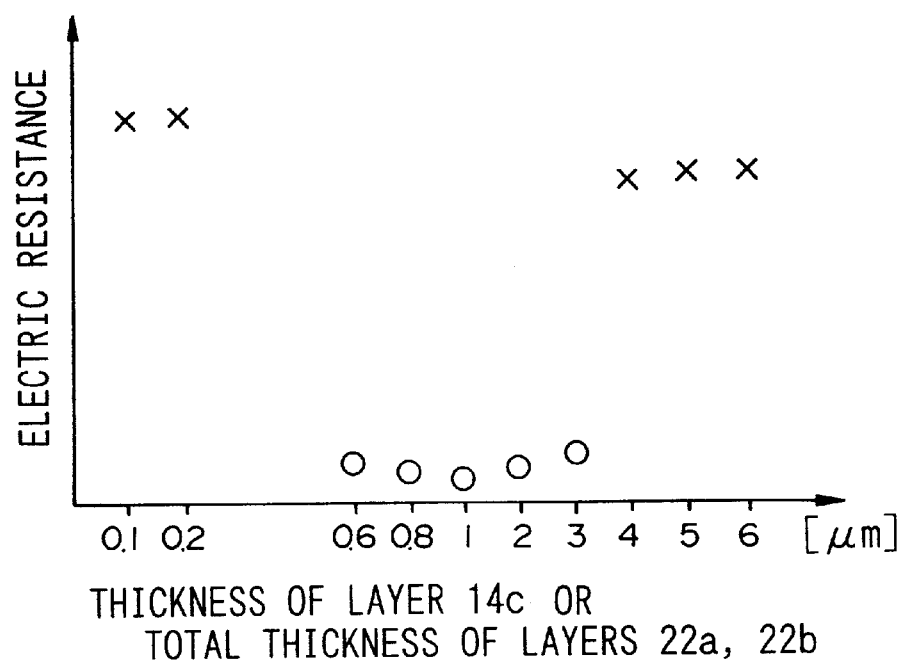
FIG. 10 is a graph showing results of studies for measurement of electric resistance with respect to the electric connection of FIG. 9.
Figure 11:
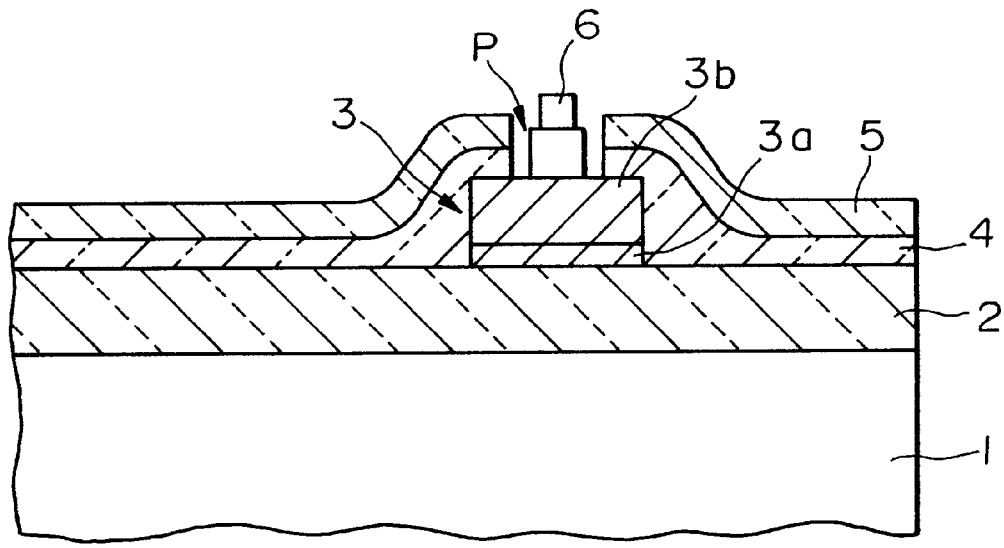
FIG. 11 is a cross sectional view showing an example of a semiconductor chip which is used by the conventional technology to perform bonding.

Next, the semiconductor chip 10 of FIG. 10 is turned over, so that positioning is carried out with respect to the wiring layer 22. That is, the Ni layer 14c of the electrode 14 comes in contact with the solder layer 22c on the wiring layer 22. In such a contact state, a laser beam L whose diameter of irradiation is narrowed to belong to a range of diameters between 1 $\mu$m and 25 $\mu$m is irradiated to a selected position of a main surface of another side of the substrate 20. That is, irradiation of the laser beam L is made to focus on the Cu layer 22b and the solder layer 22c. Thanks to the irradiation of the laser beam L, it is possible to bond the Ni layer 14c and the solder layer 22c together. As a result, the electrode 14 is electrically connected to the wiring layer 22.

The above irradiation of the laser beam is called "laser bonding". Such a technique of the laser bonding using a single laser source is performed with respect to each of the electrodes, which are arranged on the semiconductor chip 10, in turn. Incidentally, it is possible to employ a plurality of laser sources, so the laser bonding is carried out with respect to a plurality of electrodes simultaneously.

Incidentally, it is not necessary to provide laser beam permeability with respect to an overall area of the substrate 20. That is, the present method merely requires that the laser beam permeability is provided with respect to at least a part of the substrate 20 which corresponds to a connecting portion of the wiring layer 22.

(3) Third Step

Figure 3:
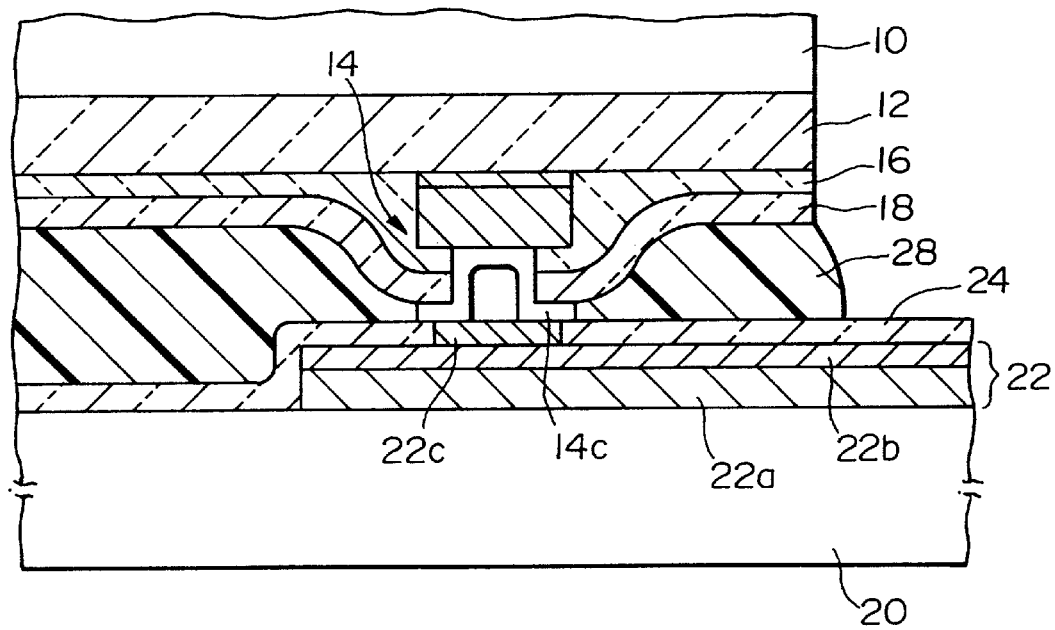
FIG. 3 is a cross sectional view showing structures of the semiconductor chip and substrate which are firmly connected together with resin.

After completion of the laser bonding, a gap between the semiconductor chip 10 and the substrate 20 is filled with insulating resin to form a resin layer 28 (see FIG. 3). Herein, the resin layer 28 works to absorb distortion which occurs due to a difference between the coefficient of thermal expansion of the semiconductor chip 10 and the coefficient of thermal expansion of the substrate 20. Therefore, the resin layer 28 is useful to increase a mounting intensity of the semiconductor chips on the substrate.

Figure 2:
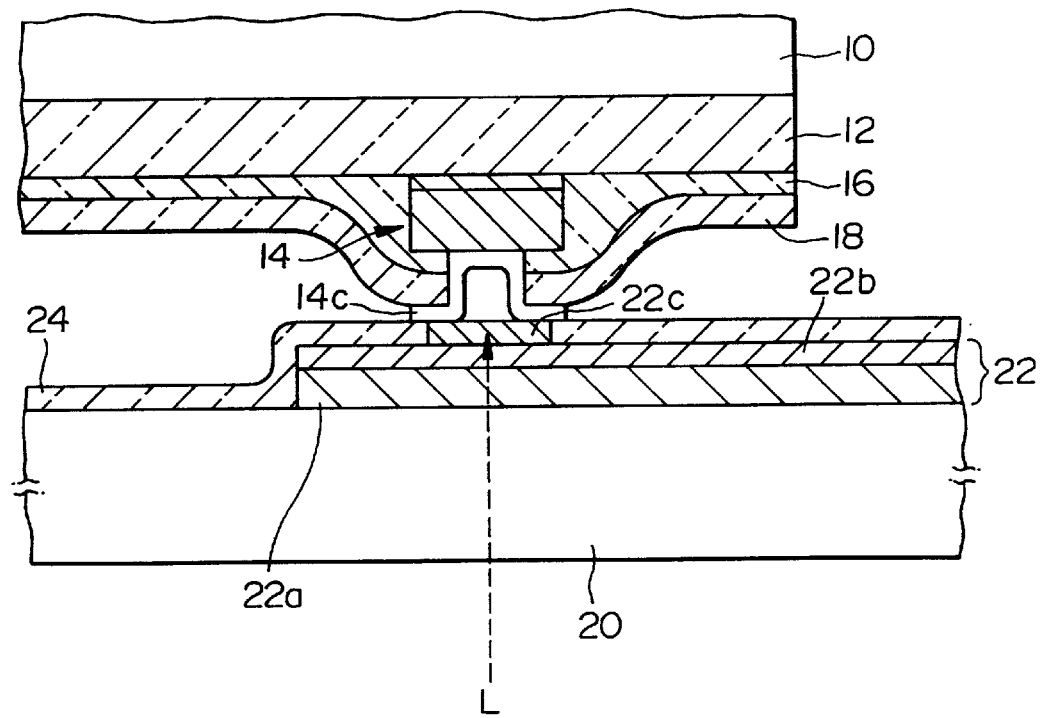
FIG. 2 is a cross sectional view showing a structure of a substrate which is bonded to the semiconductor chip of FIG. 1 in accordance with an example of bonding.
Figure 4:
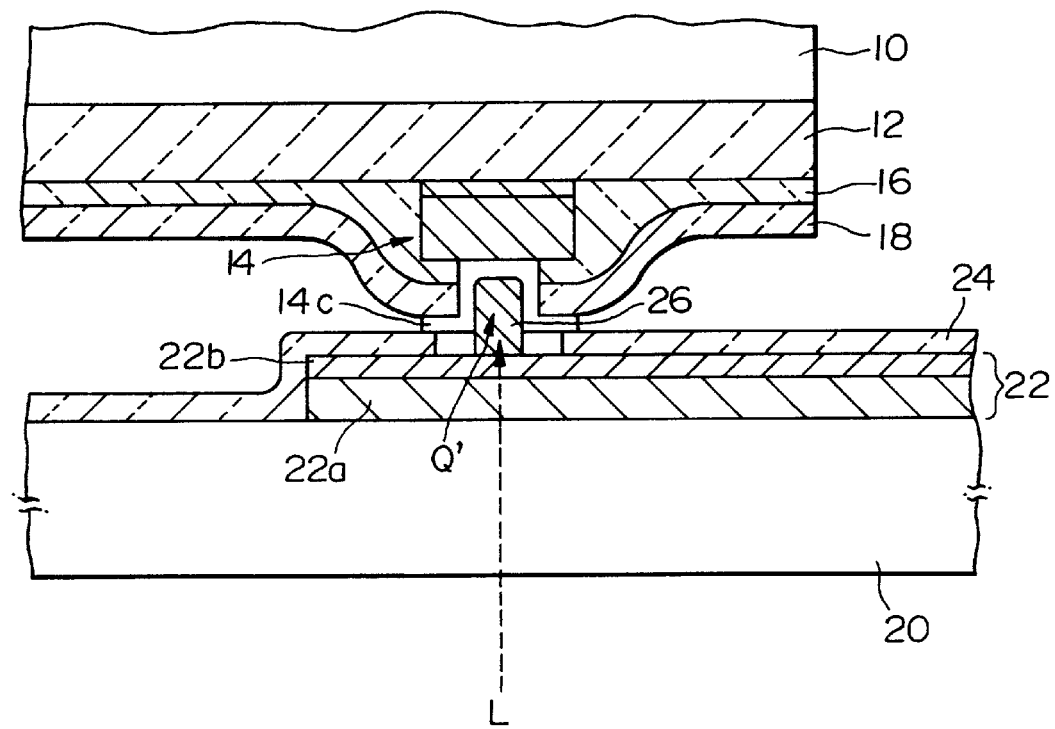
FIG. 4 is a cross sectional view showing structures of the semiconductor chip and substrate which are bonded together in accordance with another example of the bonding.
Figure 5:
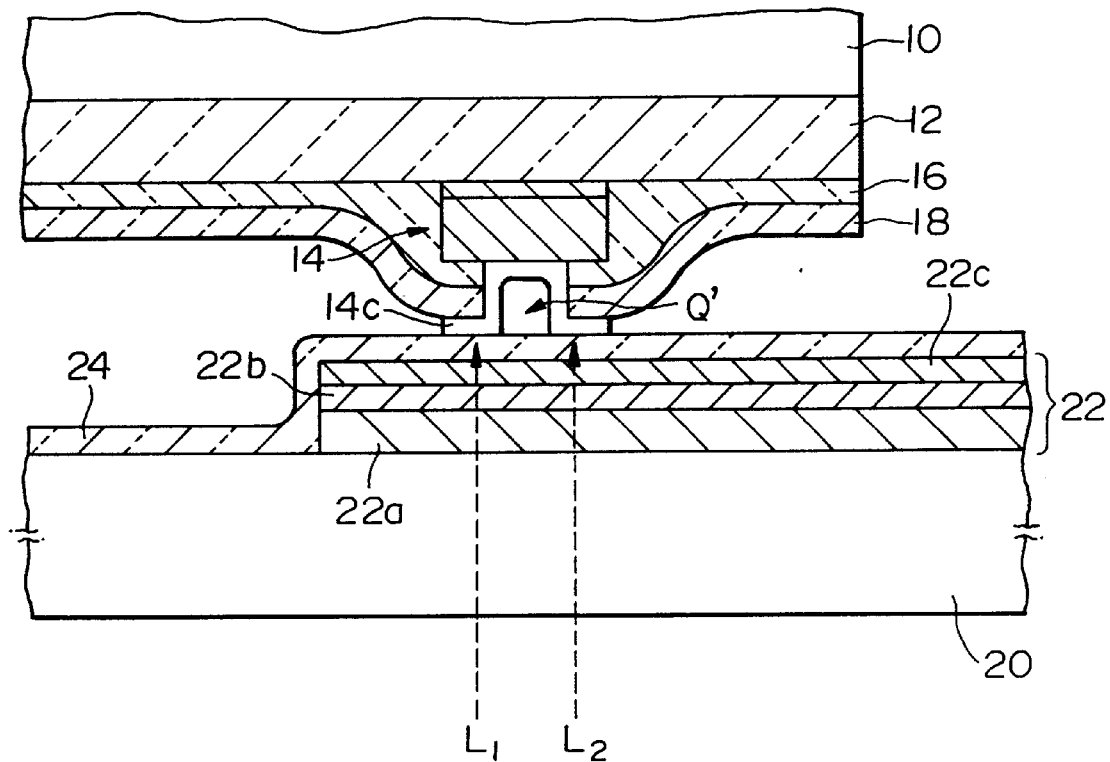
FIG. 5 is a cross sectional view showing structures of the semiconductor chip and substrate which are bonded together in accordance with a further example of the bonding.

FIGS. 4 and 5 are provided to show other examples of bonding steps, wherein parts equivalent to those of FIG. 2 are designated by the same numerals; hence, the description thereof will be omitted.

In case of FIG. 4, a solder bump 26 is provided to project from a concavity Q' of the Ni layer 14 at a top of the electrode 14 of the semiconductor chip 10. Then, the semiconductor chip 10 is turned over, wherein positioning is performed with respect to the wiring layer of the substrate 20 as shown in FIG. 4. Under a contact state where the solder bump 26 comes in contact with the Cu layer 22b of the wiring layer 22, a laser beam L is irradiated on the main surface of another side of the substrate 20 toward the solder bump 26. Thus, the solder bump 26 is connected to the Cu layer 22b. As a result, the electrode 14 is electrically connected to the wiring layer 22.

By the way, if a connection failure occurs on the semiconductor chip, the semiconductor chip is removed to mount a new semiconductor chip on the substrate. According to the method of FIG. 4, the new semiconductor chip can be easily connected to the substrate by the laser bonding.

In case of FIG. 5, the solder layer 22c is formed to conform with a same wiring pattern of the ITO layer 22a and Cu layer 22b. Thereafter, an insulating film 24 is formed to cover the wiring layer 22 containing the layers 22a to 22c on the main surface of the substrate 20. Incidentally, it is possible to form the solder layer 22c with respect to a part of the Cu layer 22b only. In that case, the insulating film 24 is formed to cover the above solder layer 22c. Herein, no contact hole is formed for the insulating film 24.

Next, the semiconductor chip 10 is turned over to perform positioning with respect to the wiring layer 22 of the substrate 20. Under a contact state where the Ni layer 14c of the electrode 14 comes in contact with the insulating film 24, a laser beam L1 or L2 is irradiated to the main surface of another side of the substrate 20. This laser beam partially breaks the insulating film 24, so that the Ni layer 14c is connected to the solder layer 22c. As a result, the electrode 14 is electrically connected to the wiring layer 22.

Figure 6:
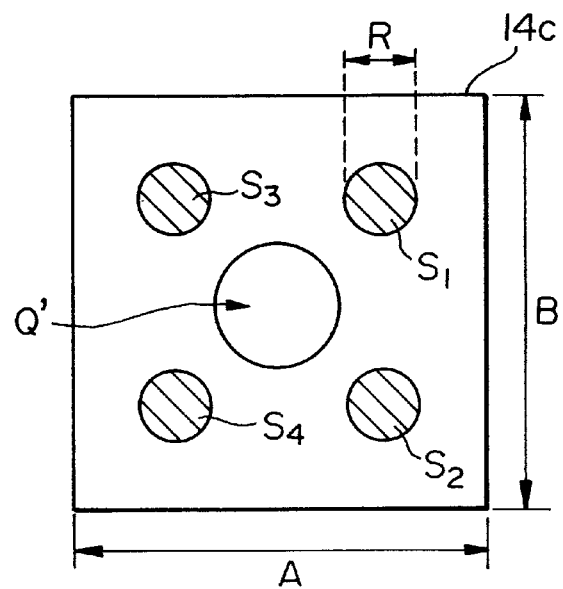
FIG. 6 is a plan view showing several locations of a Ni layer at which bonding is performed in accordance with the bonding of FIG. 5.

The method of FIG. 5 does not require provision of the contact hole with respect to the insulating film 24. For this reason, the method of FIG. 5 has simplicity in manufacturing process. If bonding is performed using the laser beams L1 and L2 with respect to multiple locations of the semiconductor chip and substrate, it is possible to improve reliability of electric connection of the semiconductor chip and substrate. For example, the bonding can be performed with respect to four independent locations S1 to S4 (see FIG. 6) around the concavity Q' of the Ni layer 14c of the electrode 14. Now suppose that a plane of the Ni layer 14c has a square shape while both of two sides A and B have a same length of 25 µm. In that case, both of the laser beams L1 and L2 have a same diameter of irradiation 'R' which is narrowed to 4 µm. Using the laser beams L1 and L2 whose diameter of irradiation is narrowed to 4 µm, it is possible to perform bonding with respect to the four locations S1 to S4. In that case, even if a bonding failure occurs on one location within the four locations S1 to S4, it is possible to secure electric connections at the remaining three locations.

Next, a description will be given with respect to working examples of the bonding in conjunction with FIGS. 7 to 10.

Figure 7:
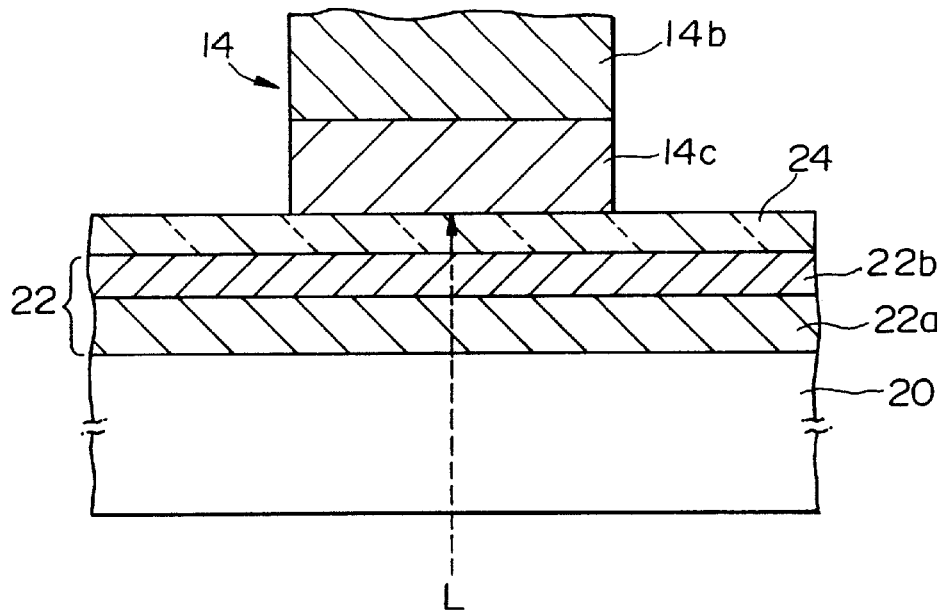
FIG. 7 is a cross sectional view showing an electric connection between the semiconductor chip and substrate in accordance with a first working example of bonding.

FIG. 7 shows a first working example of the bonding, wherein parts equivalent to those of FIG. 2 will be designated by the same numerals; hence, the description thereof will be omitted.

Figure 8:
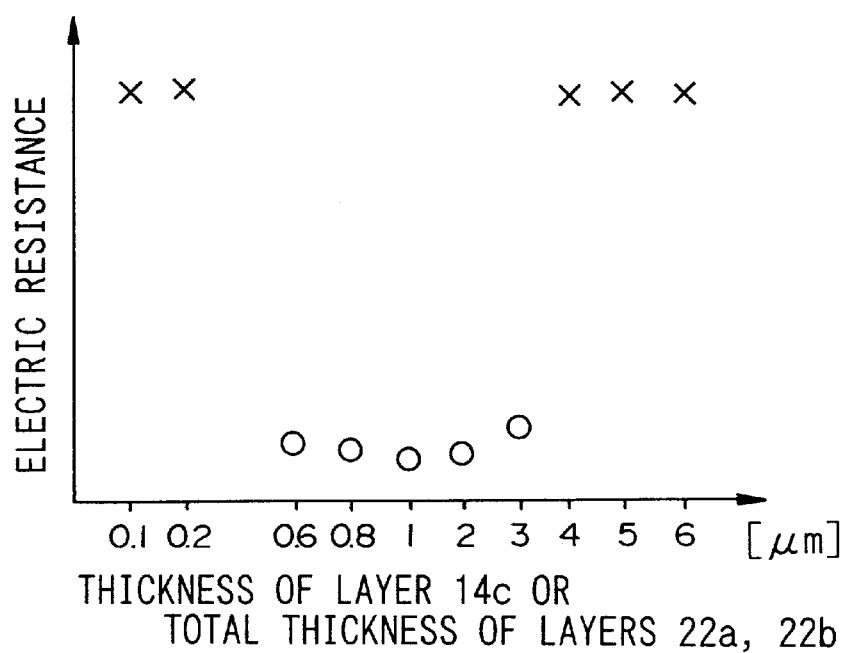
FIG. 8 is a graph showing results of studies for measurement of electric resistance with respect to the electric connection of FIG. 7.

In FIG. 7, a wiring layer 22 containing an ITO layer 22a and a Cu layer 22b is formed on a main surface of a substrate 20. In addition, an insulating film 24 such as polyimide resin is formed to cover the wiring layer 22. We have made studies on samples of the substrate having different values in the total thickness of the ITO layer 22a and the Cu layer 22b. FIG. 8 shows results of the studies, wherein a horizontal axis represents a total thickness of the layers 22a and 22b while a vertical axis represents an electric resistance.

Next, a semiconductor chip to be mounted on the above substrate 20 shown in FIG. 7 is constructed as shown in FIG. 1, wherein a main surface thereof is covered with an insulating film 12. In addition, an electrode 14 is provided on the insulating layer 12. The electrode 14 corresponds to lamination of a WSi layer 14a, an Al layer 14b and a Ni layer 14c. We have made studies on samples of the semiconductor chip having different values in the thickness of the Ni layer 14c, wherein the horizontal axis of FIG. 8 represents the thickness of the Ni layer 14c.

Now, each sample of the semiconductor chip is mounted on each sample of the substrate 20. Herein, the studies are made under a contact state as shown in FIG. 7 where the Ni layer 14c comes in contact with the insulating film 24. Then, a laser beam L is irradiated to a main surface of another side of the substrate 20. Thus, the insulating film 24 is partially broken so that the Ni layer 14c is bonded to the Cu layer 22b. The studies use the so-called YAG laser having a wavelength of 1,064 nm, where 'YAG' stands for yttrium aluminum garnet. Herein, output energy is set at 9 mJ/pulse; and a pulse width is set at 10 nsec. A laser output is suppressed using a filter (or filters) at 75%.

After completion of the laser bonding which is effected on a combination of a sample of the semiconductor chip and a sample of the substrate, we have measured electric resistance between the electrode and wiring layer. Results of the above measurement are shown in FIG. 8. Herein, a symbol "○" corresponds to a combination of samples which has a low electric resistance so that a good contact condition is established between the semiconductor chip and substrate, whilst a symbol "X" corresponds to a combination of samples which has a high electric resistance so that a contact condition is not good. Through the studies whose results are shown in FIG. 8, it is acknowledged that a good contact condition can be obtained under a condition where the thickness of the Ni layer 14c ranges between 0.6 µm and 3 µm while the total thickness of the ITO layer 22a and the Cu layer 22b ranges between 0.6 µm and 3 µm.

Figure 9:
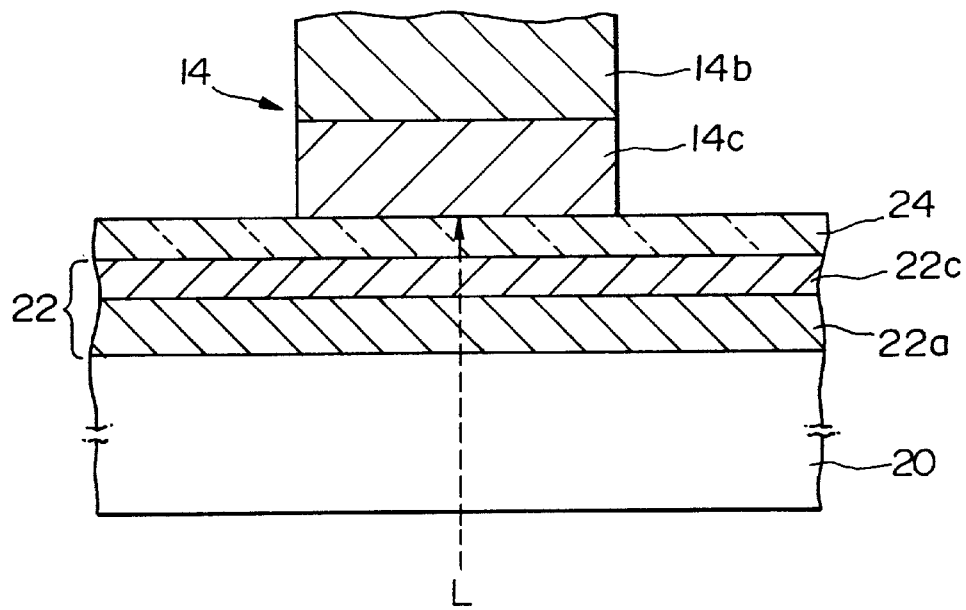
FIG. 9 is a cross sectional view showing an electric connection between the semiconductor chip and substrate in accordance with a second working example of bonding.

FIG. 9 shows a second working example of the bonding, wherein parts equivalent to those of FIG. 7 are designated by the same numerals; hence, the description thereof will be omitted occasionally.

In FIG. 9, a wiring layer 22 containing an ITO layer 22a and a solder layer 22c is formed on a main surface of a substrate 20. In addition, an insulating film 24 such as polyimide resin is formed to cover the wiring layer 22. As the solder material used for formation of the solder layer 22c, we use the solder material whose chemical composition is In-20Sn-0.8 Ag. We have made studies with respect to samples of the substrate 20 having different values in total thickness of the ITO layer 22a and the solder layer 22c. FIG. 10 shows results of the studies, wherein a horizontal axis represents the total thickness of the layers 22a and 22c. Like the aforementioned first working example of FIG. 7, a semiconductor chip is constructed to have an electrode 14 containing an Al layer 14b and a Ni layer 14c. We have made samples of the semiconductor chip having different values in thickness of the Ni layer 14c.

Now, each sample of the semiconductor chip is mounted on each sample of the substrate 20 to establish a contact state where the Ni layer 14c comes in contact with the insulating film 24. In the studies, a laser beam L is irradiated to a main surface of another side of the substrate 20 as shown in FIG. 9. Thus, the insulating film 24 is partially broken so that the Ni layer 14c is bonded to the solder layer 22c. The studies use the YAG laser wherein a wavelength is set at 1,064 nm, output energy is set at 6 mJ/pulse and a pulse width is set at 10 ns. In addition, a laser output is suppressed using a filter (or filters) at 75%.

After completion of the laser bonding which is effected with respect to a combination of a sample of the semiconductor chip and a sample of the substrate, we have measured electric resistance between the electrode and wiring layer. So, results of the above measurement are shown in FIG. 10. FIG. 10 shows similar results of FIG. 8.

As described heretofore, this invention is characterized in that the electrode of the semiconductor chip is connected (or bonded) to the wiring layer of the substrate by using the laser bonding. Thus, it is possible to provide reduction of the contact area between the semiconductor chip and substrate. For this reason, it is possible to provide reduction in size of the electrode and therefore reduction in size of the semiconductor chip.

According to the conventional technology, however, the lead (Pb) is required to provide a good electric connection between the semiconductor chip and substrate with a high reliability. In contrast, this invention employs the laser bonding to provide the electric connection between the semiconductor chip and substrate. The laser bonding does not necessarily require Pb in the solder. If Pb is not used in the solder, it is possible to eliminate a possibility in occurrence of an environmental problem. It may be possible that the conventional technology provides the electric connection using the solder which excludes Pb. However, such a non-Pb soldering technique of the conventional technology is capable of providing the electric connection only in an atmosphere of $N_2$ (nitrogen). In contrast, this invention is capable of providing a good electric connection between the semiconductor chip and substrate without the atmosphere of $N_2$. So, this invention does not require the atmosphere adjustment facilities which are expensive in cost.

Figure 12:
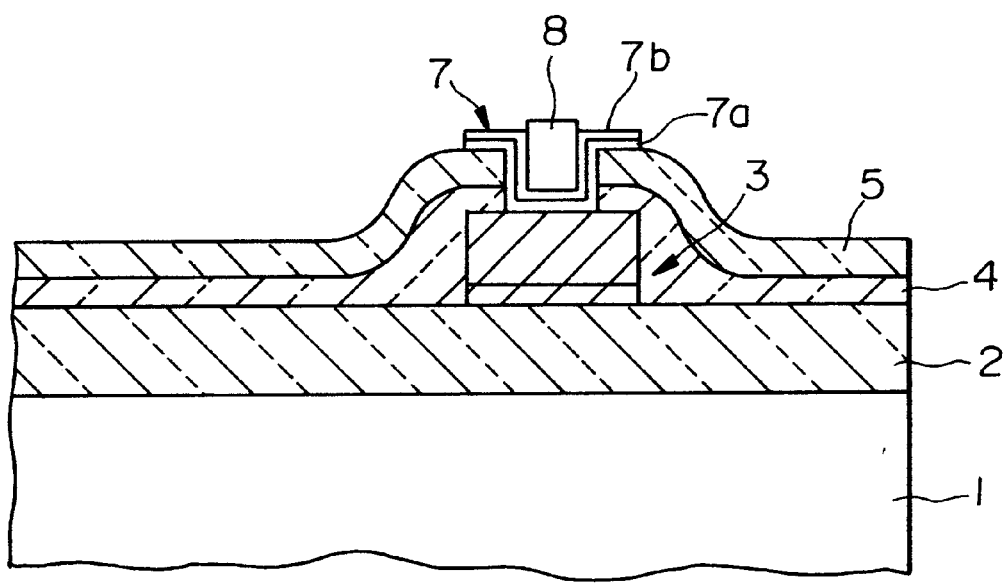
FIG. 12 is a cross sectional view showing another example of a semiconductor chip which is used by the conventional technology to perform bonding.

Furthermore, this invention is simple in processes and facilities as compared with the conventional technology shown in FIG. 12. So, this invention is capable of providing reduction in cost for manufacturing.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor chip mounting method comprising the steps of:

providing a semiconductor chip having a main surface on which an electrode is formed;

providing a substrate having a main surface on which a wiring layer is formed, wherein at least a part of the substrate corresponding to a connecting portion of the wiring layer has a laser beam permeability; and bonding the electrode of the semiconductor chip to the connecting portion of the wiring layer by irradiating a laser beam toward the connecting portion through the part of the substrate under a contact state where the electrode of the semiconductor chip comes in contact with the connecting portion of the wiring layer of the substrate, the laser beam being focussed solely on an area within the connection portion so that the irradiation is performed without a mask.

2. A semiconductor chip mounting method comprising the steps of:

providing a semiconductor chip having a main surface on which an electrode is formed, wherein an adhesive bump is provided onto a top portion of the electrode;

providing a substrate having a main surface on which a wiring layer is formed, wherein at least a part of the substrate corresponding to a connecting portion of the wiring layer has a laser beam permeability; and bonding the electrode of the semiconductor chip to the connecting portion of the wiring layer by irradiating a laser beam toward the adhesive bump through the part of the substrate under a contact state where the adhesive bump of the electrode of the semiconductor chip comes in contact with the connecting portion of the wiring layer of the substrate, the laser beam being focussed solely on an area within the bump so that the irradiation is performed without a mask.

3. A semiconductor chip mounting method comprising the steps of:

providing a substrate having a main surface on which a wiring layer having a connecting portion is formed and an insulating film is formed to cover the wiring layer, including the connecting portion, wherein at least a part of the substrate corresponding to the connecting portion has a laser beam permeability; and bonding the electrode of the semiconductor chip to the connecting portion of the wiring layer by irradiation of a laser beam, wherein the laser beam is irradiated toward the connecting portion of the wiring layer through the part of the substrate under a contact state where the electrode of the semiconductor chip comes in contact with the insulating film on the connecting portion of the wiring layer of the substrate so that the insulating film is partially broken.

4. A semiconductor chip mounting method comprising the steps of:

providing a semiconductor chip having an electrode which is covered with a first insulating film wherein a connection layer is formed to cover a contact hole which is formed through the insulating film to be in contact with a part of the electrode;

providing a substrate having a laser beam permeability as well as a wiring layer which is covered with a second insulating film, a part of which is removed to form a solder layer to be in contact with a part of the wiring layer at a position matching with the contact hole of the semiconductor chip;

establishing a contact state where the semiconductor chip is placed in contact with the substrate such that the connection layer of the semiconductor chip comes in contact with the solder layer of the substrate; and p1 irradiating a laser beam toward the solder layer of the substrate so that the connection layer is bonded to the solder layer, the laser beam being focussed solely on an area within the connection portion so that the irradiation is performed without a mask:

whereby the electrode of the semiconductor chip is electrically connected to the wiring layer of the substrate through the connection layer and the solder layer which are bonded together.

5. A semiconductor chip mounting method according to claim 4 further comprising a step of:

providing a resin layer which fills a gap between the semiconductor chip and the substrate which are bonded together.

6. A semiconductor chip mounting method according to claim 4 wherein the connection layer is a Ni layer made of nickel.

7. A semiconductor chip mounting method according to claim 4 wherein a diameter in irradiation of the laser beam ranges between 1 $\mu$m and 25 $\mu$m.

8. A semiconductor chip mounting method according to claim 4 wherein the connection layer has a thickness which ranges between 0.6 $\mu$m and 3 $\mu$m while the wiring layer has a thickness which ranges between 0.6 $\mu$m and 3 $\mu$m.

9. A semiconductor chip mounting method comprising the steps of:

providing a semiconductor chip having an electrode which is covered with a first insulating film, wherein a connection layer is formed to cover a contact hole which is formed through the first insulating film to be in contact with a part of the electrode, and wherein a solder bump is provided to project from a concavity of the connection layer;

providing a substrate having a laser beam permeability as well as a wiring layer which is covered with a second insulating film;

establishing a contact state where the semiconductor chip is placed in contact with the substrate such that the solder bump of the semiconductor chip directly comes in contact with a part of the wiring layer of the semiconductor; and irradiating a laser beam through the substrate and toward the solder bump of the semiconductor chip so that the solder bump is bonded to the wiring layer of the substrate, whereby the electrode of the semiconductor chip is electrically connected to the wiring layer of the substrate through the connecting layer and the solder bump.

10. A semiconductor chip mounting method according to claim 9 wherein the connection layer is a Ni layer made of nickel.

11. A semiconductor chip mounting method according to claim 9 wherein a diameter in irradiation of the laser beam ranges between 1 $\mu$m and 25 $\mu$m.

12. A semiconductor chip mounting method according to claim 9 wherein the connection layer has a thickness which ranges between 0.6 $\mu$m and 3 $\mu$m while the wiring layer has a thickness which ranges between 0.6 $\mu$m and 3 $\mu$m.

* * * * *